United States Patent
Lin et al.

(10) Patent No.: US 12,211,782 B2
(45) Date of Patent: Jan. 28, 2025

(54) SEMICONDUCTOR PACKAGE DIELECTRIC SUSBTRATE INCLUDING A TRENCH

(71) Applicant: Taiwan Semiconductor Manufacturing Company, Ltd., Hsinchu (TW)

(72) Inventors: Yueh-Ting Lin, Taipei (TW); Hua-Wei Tseng, New Taipei (TW); Ming Shih Yeh, Zhubei (TW); Der-Chyang Yeh, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/232,523

(22) Filed: Aug. 10, 2023

(65) Prior Publication Data
US 2023/0386989 A1 Nov. 30, 2023

Related U.S. Application Data

(62) Division of application No. 17/461,828, filed on Aug. 30, 2021, now Pat. No. 11,961,796.

(51) Int. Cl.
*H01L 23/498* (2006.01)
*H01L 23/00* (2006.01)
*H01L 23/31* (2006.01)
*H01L 23/538* (2006.01)
*H01L 25/11* (2006.01)

(52) U.S. Cl.
CPC .... *H01L 23/49838* (2013.01); *H01L 23/3128* (2013.01); *H01L 23/49816* (2013.01); *H01L 23/49822* (2013.01); *H01L 23/49833* (2013.01); *H01L 23/5389* (2013.01); *H01L 24/16* (2013.01); *H01L 24/73* (2013.01); *H01L 25/117* (2013.01); *H01L 2224/16146* (2013.01); *H01L 2224/73204* (2013.01); *H01L 2225/1076* (2013.01)

(58) Field of Classification Search
None
See application file for complete search history.

(56) References Cited

U.S. PATENT DOCUMENTS

| | | | |
|---|---|---|---|
| 2010/0044880 A1* | 2/2010 | Aokura | H01L 23/49822 257/777 |
| 2011/0260309 A1* | 10/2011 | Lee | G01R 1/0466 439/55 |
| 2017/0125346 A1* | 5/2017 | Liu | H01L 21/76895 |
| 2020/0092658 A1* | 3/2020 | Zou | H04R 19/005 |

FOREIGN PATENT DOCUMENTS

CN 109860136 A * 6/2019 ........... H01L 21/561

* cited by examiner

*Primary Examiner* — Hung K Vu
(74) *Attorney, Agent, or Firm* — FOLEY & LARDNER LLP (57) ABSTRACT

A package comprises at least one first device die, and a redistribution line (RDL) structure having the at least one first device die bonded thereto. The RDL structure comprises a plurality of dielectric layers, and a plurality of RDLs formed through the plurality of dielectric layers. A trench is defined proximate to axial edges of the RDL structure through each of the plurality of dielectric layers. The trench prevents damage to portions of the RDL structure located axially inwards of the trench.

20 Claims, 9 Drawing Sheets

SEMICONDUCTOR PACKAGE DIELECTRIC SUSBTRATE INCLUDING A TRENCH

CROSS-REFERENCE TO RELATED APPLICATIONS

This application is a divisional of U.S. patent application Ser. No. 17/461,828, filed Aug. 30, 2021, and titled "SEMICONDUCTOR PACKAGE DIELECTRIC SUBSTRATE INCLUDING A TRENCH," the entire contents of which are incorporated herein by reference for all purposes.

BACKGROUND

The present disclosure generally relates to semiconductor die packages, and in particular to Integrated Fan-Out ("InFO") packages.

With the evolution of semiconductor technologies, semiconductor chips/dies are becoming increasingly smaller. In the meantime, more functions have to be integrated into semiconductor dies to increase processing speed and functionality in a small area. Accordingly it is desirable to have increasingly greater number of Input/Output (I/O) pads packed into smaller areas, and the density of the I/O pads rise quickly over time. As a result, the packaging of the semiconductor die becomes more difficult, which adversely affects the yield of the packaging.

Conventional package technologies can be divided into two categories. In the first category, dies on a wafer are packaged before they are sawed to separate dies out of a wafer. This packaging technology has some advantages such as greater throughput and lower cost. However, such packaging technologies also have some drawbacks. As aforementioned, the sizes of the dies are becoming increasingly smaller, and the respective packages can only be fan-in type packages, in which the I/O pads of each die are limited to a region directly over the surface of the respective die. With the limited areas of the dies, the number of I/O pads is limited due to the limitation of the pitch of the I/O pads. If the pitch of the pads is to be decreased, solder bridges may occur. Additionally, under the fixed ball-size requirement, solder balls must have a certain size which in turn limits the number of solder balls that can be packaged on the surface of a die.

In the other category of packaging, dies are sawed from wafers before they are packaged, and only "known-good-dies" are packaged. An advantageous feature of this packaging technology is the possibility of forming fan-out packages, which means the I/O pads on a die can be redistributed to a greater area than the die, and hence the number of I/O pads packed on the surfaces of the dies can be increased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some packages (e.g., InFO packages) are disposed in a housing or a tray, for example, during transportation of such InFO packages. In some instances, the housing may have a shape such that axial edges of a RDL structure included in such packages may contact a surface of the housing. The force exerted by the housing on the axial edges of the RDL structure may damage the dielectric substrate, and may cause at least the axial edges of the RDL structure to delaminate from a molding that the RDL structure is bonded to, which is undesirable.

Embodiments of the present disclosure are discussed in the context of semiconductor packages, particularly InFO packages that have a trench defined proximate to axial edges of the dielectric substrate. The trench divides the RDL structure into a first portion that includes actives structures of the dielectric substrate, and a second portion separated from the first portion by the trench. When such packages are disposed in the housing, the second portion contacts the housing, and stresses exerted by the housing are exerted on the second portion. Since the trench separates the first portion including the active structures from the second portion, the stresses exerted by the housing are limited to the second portion. Therefore, any damage that occurs to the RDL structure is limited to the second portion and is not transmitted to the first portion. Since the second portion does not include any active structures, any damage to the second portion does not affect the functionality or appearance of the first portion. In this manner, yield and reliability of the package is improved.

While various embodiments described herein are described with respect to InFO packages, it should be appreciated that the concepts described herein are equally applicable to any other semiconductor package, for example, a transistor package, a memory package, an integrated circuit package, motherboards, circuit boards, etc.

Figure 1A:
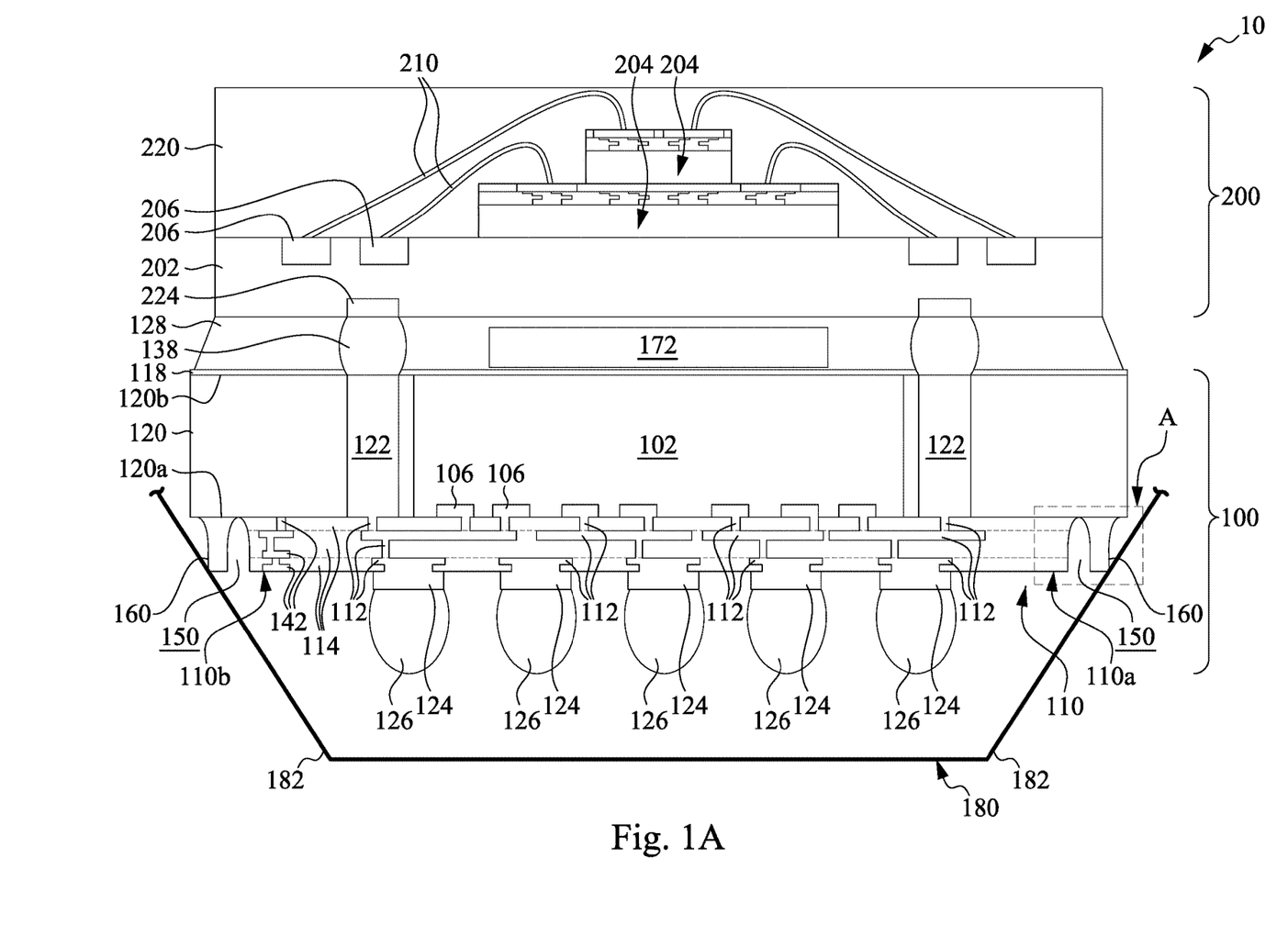
FIG. 1A is a side cross-section view of a package that includes a first package having a redistribution line (RDL) structure having a trench defined proximate to axial edges thereof, and a second package bonded to the first package, according to an embodiment.

FIG. 1A is a side cross-section view of a package 10, according to an embodiment. The package 10 includes a first package 100 including a RDL structure 110, and a first device die 102. The package 10 also includes a second package 200 bonded to the first package 100. The second package 200 includes a second device die 204.

Expanding further, the first package 100 includes the RDL structure 110 having the first device die 102 bonded thereto. The RDL structure 110 includes a plurality of dielectric layers 114 stacked on top of each other to form an integrated structure. In some embodiments, the dielectric layers 114 are formed of organic materials such as polymers, such as, for example, polybenzoxazole (PBO), benzocyclobutene (BCB), polyimide, or the like. In other embodiments, the dielectric layers 114 may be formed of an inorganic material, such as, for example, silicon oxide, silicon nitride, silicon oxynitride, or the like. A plurality of redistribution lines (RDLs) 112 are formed through the plurality of dielectric layers 114. Moreover, edge RDLs 142 are also formed through the plurality of dielectric layers 114 and are located proximate to axial edges of the RDL structure 110. The RDLs 112 and the edge RDLs 142 may be formed of a conducting materials, for example, metallic materials such as copper, aluminum, nickel, titanium, alloys thereof, or multilayers thereof. In some embodiments, the edge RDLs 142 are dummy RDLs that do not interface with the first device die 102. In other embodiments, the edge RDLs 142 may also interface with the first device die 102 or any other structure included in the package 10.

The first device die 102 may include a semiconductor substrate and integrated circuit devices (e.g., active devices such as transistors, memories, resistors, capacitors, etc.), for example, at a front surface of the semiconductor substrate (e.g., facing down i.e., towards the RDL structure 110). In some embodiments, the first device die 102 may include a logic die such as a Central Processing Unit (CPU) die, a Graphic Processing Unit (GPU) die, a mobile application die, or the like.

Figure 1B:
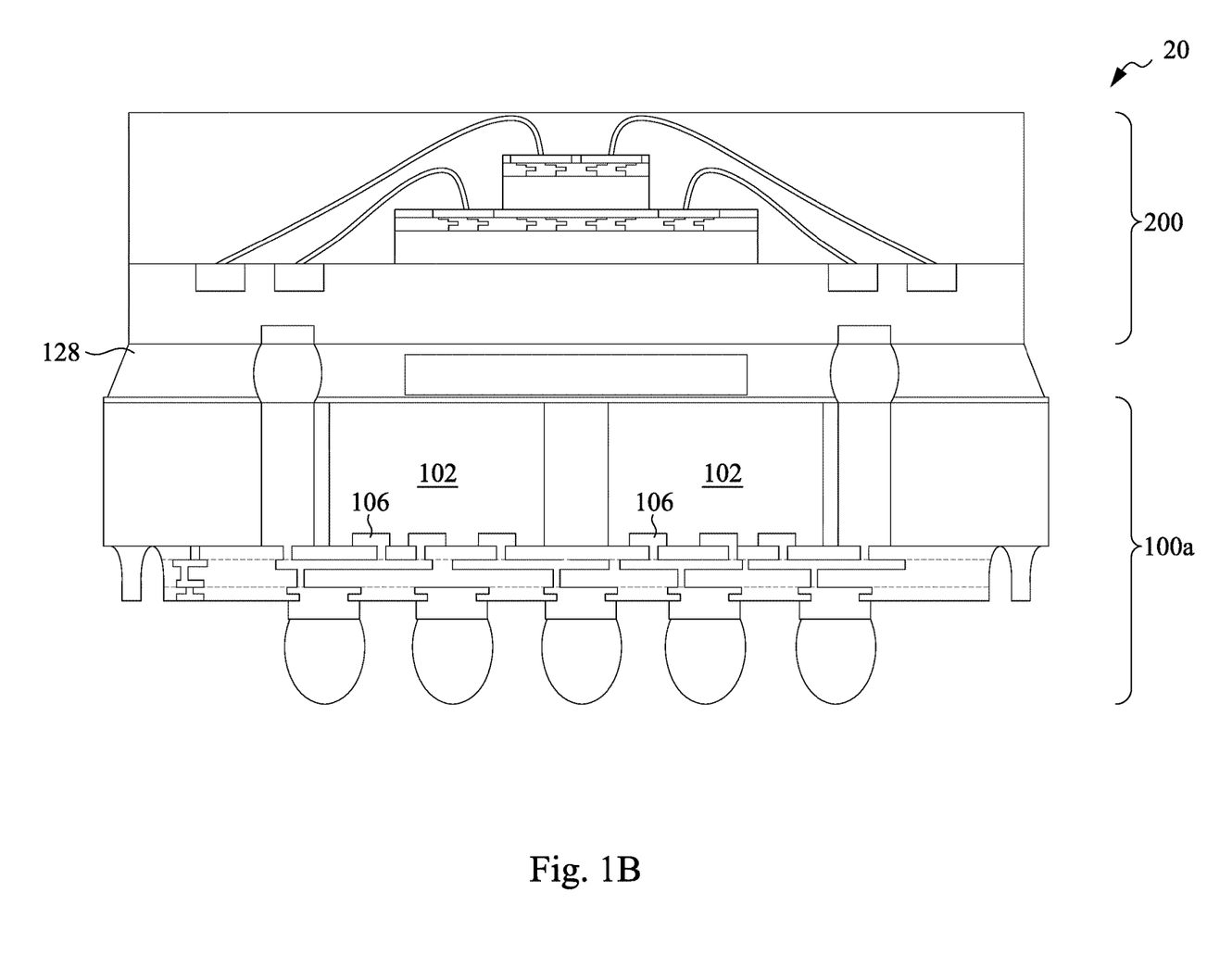
FIG. 1B is a side cross-section view of a package that includes a second package having a plurality of first dies bonded to a first substrate, according to an embodiment.

As shown in FIG. 1A, a front side of the first device die 102 faces down towards the RDL structure 110 and is bonded to the redistribution lines 112. While shown as including a single first device die 102, in other embodiments, the first package 100 may include more than one first device die disposed at the same level. For example, FIG. 1B is side cross-section view of another package 20. The package 20 includes a first package 100a and the second package 200. The first package 100a is substantially similar to the first package 100 with the difference that a plurality of first device dies 102 are encapsulated within the molding layer 120. In some embodiments, each of the more than one first device dies 102 may include an active first device die, i.e., each of the first device dies may include active circuits that take part in the overall operation of the package 20. In other embodiment, at least a portion of the more than one first device dies 102 may include dummy device dies that do not take part in operation of the package 20, but may increase mechanical strength of the first package 100a, for example, to reduce warpage.

Referring again to FIG. 1A, the first device die 102 is molded in molding layer 120, which surrounds the first device die 102 when viewed in the top view of the structure of FIG. 1A. Molding layer 120 may be formed from a molding material such as a molding compound, a molding underfill, a resin, an epoxy, or the like. In some embodiments, the molding material may be formed by applying a non-solid material to encircle the first device die 102 therein, and then curing the molding material, for example, through an Ultra-Violet (UV) curing or a thermal curing process, so that the applied non-solid material is solidified. A bottom surface 120a of the molding layer 120 may be levelled with a bottom end of the first device die 102. The bottom end of the device die may include metal pillars/pads 106 (e.g., copper pillars) that may be in contact with, and bonded to RDLs 112. A top surface 120b of the molding layer 120 may be level with or higher than a back surface of the first device die 102, which is distal from the RDL structure 110.

In some embodiments, the back surface of the first device die 102 may be overlapped by a die-attach film (not shown), for example, a dielectric film that adheres the first device die 102 to an overlying top dielectric layer 118. In some embodiments, the die-attach film and/or the top dielectric layer 118 may be formed of organic materials such as polymers, such as, for example, polybenzoxazole (PBO), benzocyclobutene (BCB), polyimide, or the like. In other embodiments, the die-attach film and/or the top dielectric layer 118 may be formed of an inorganic material, such as, for example, silicon oxide, silicon nitride, silicon oxynitride, or the like. In some embodiments, top side RDLs (not shown) may be formed in the top dielectric layer 118. The first package 100 may also be referred to as an InFO package since RDLs 112 and top side RDLs extend beyond axial edges of first device die(s) 102, and the molding layer 120 is integrated with the formation of the respective RDLs 112 and/or the top side RDLs.

Through vias 122 may be formed through the molding layer 120. In some embodiments, the through-vias 122 may have top surfaces that are level with the top surface 120b of the molding layer 120, and bottom surfaces that are level with the bottom surface 120a of the molding layer 120. The through-vias 122 may electrically connect at least a portion of the RDLs 112 to top side RDLs that may be formed in the top dielectric layer 118, and also be physically coupled to the RDLs 112 and the top side RDLs. The through-vias 122 may be formed of a conductive material, for example, a metallic material such as copper, aluminum, tungsten, nickel, titanium, or alloys thereof. In some embodiments, formation of the through-vias 122 may include forming a mask layer (such as a photo resist, not shown) over a metal seed layer (not shown), and plating through-vias 122 in the openings in the mask layer. The mask layer is then removed. In other embodiments, through-vias 122 are pre-formed as metal posts, and are placed at the desired locations.

Electrical connectors 124, which are formed of a non-solder metallic material(s), are formed at the bottom surface of the first package 100 that is distal from the first device die 102. In some embodiments, the electrical connectors 124 may include Under-Bump Metallurgies (UBMs) or metal pads. In other embodiments, the electrical connectors 124 may include metal pillars, for example, copper pillars. In some embodiments, the electrical connectors 124 may include metal pads formed from any suitable metallic material, for example, copper, aluminum, titanium, nickel, palladium, gold, multi-layers, or alloys thereof. In some embodiments, bottom surfaces of the electrical connectors 124 may be level with a bottom surface of the bottom most dielectric layer 114 included in the RDL structure 110. In some embodiments, the bottom surfaces of the electrical connectors 124 may extend below the bottom surface of the bottom most dielectric layer 114. In some embodiments, solder regions 126 are attached to bottom surfaces of the electrical connectors 124.

In some embodiments, a passivation layer 128 may be disposed above the top dielectric layer 118, and may be used to protect underlying top RDLs from damage due to moisture and/or other detrimental chemicals. In various embodiments, the passivation layer 128 may include one or more layers of polymers, such as, for example, PBO or polyimide. In some embodiments, the passivation layer 128 may also be formed of solder mask or inorganic materials such as silicon nitride, silicon oxide, or multi-layers of the organic and/or inorganic materials. The passivation layer 128 may be formed as a blanket layer covering the entire molding layer 120. In some embodiments, the passivation layer 128 may be disposed as a liquid or a gel, and is then cured. In some embodiments, the passivation layer 128 may include a preformed film that is placed over the top dielectric layer 118.

In some embodiments, a spacer 172 may be disposed on or within the passivation layer 128. The spacer 172 may be formed of an organic material, which may be dispensed as a non-solid material (liquid or gel). The dispensed organic material may then be cured, through UV curing or thermal curing such that the spacer 172 has a solid form. The dispensing of the spacer 172 may be achieved through stencil printing or dispensing through a nozzle. In some embodiments, the first package 100 may be part of a wafer-level package, which includes a plurality of first packages, each having an identical structure as the first package 100. In such embodiments, the plurality of spacers may be disposed with each of the packages having one of the plurality of spacers disposed thereon. Moreover, stencil printing or nozzle dispensing may be performed at the wafer-level, and the plurality of spacers are cured simultaneously. In other embodiments, the spacer 172 or spacers may be pre-formed and then mounted on the passivation layer 128. In such embodiments, the spacer 172 may be formed from metal or metal alloys (e.g., copper, aluminum, stainless steel, etc.), ceramics, an organic material (e.g., polymers), or a semiconductor material (e.g., silicon, glass, or the like). In some embodiments, the spacer 172 may include an active or dummy die (e.g., a memory die such as Dynamic Random Access Memory die). In some embodiments, the spacer 172 may be flip bonded to the top RDLs.

In some embodiments, spacer 172 may include a portion aligned with the center of the first package 100, i.e. the center of first package 100 in a direction extending perpendicular to the major planes (such as a top surface and a bottom surface) of the first package 100. In other embodiments, the spacer 172 does not include any portion aligned to the center of the first package 100. In such embodiments, the spacer 172 may include portions on opposite sides of the center, and the spacer 172 may be symmetric relative to center. The spacer 172 may have a horizontal width that is smaller than a respective horizontal width of the first device die 102. In other embodiments, the spacer 172 may have a horizontal width that is equal to or larger than the respective horizontal width of the first device die 102. In some embodiments, the spacer 172 may overlap part of, or an entirety of the first device die 102. In some embodiments, the spacer 172 may be aligned with the first device die 102. In other embodiments, the spacer 172 may be misaligned with the underlying first device die 102. In some embodiments, the spacer 172 may have a width in a range of 20 microns to 400 microns, inclusive.

Portions of the passivation layer 128, and in some embodiments, also the top dielectric layer 118, may be removed (e.g., etched) to expose the underlying top side RDLs, or a top surface of the through-vias 122 so as to form openings in the passivation layer 128, and in some embodiments, also the top dielectric layer 118. The openings may be formed prior to, or after forming the spacer 172. The openings may be formed through a laser cutting or drilling process. In some embodiments, in which the passivation layer 128 is formed from a light-sensitive material (e.g., PBO or polyimide), the formation of the openings may be formed by a lithography and development step. In some embodiments, the openings may be aligned to a ring encircling a central region of the passivation layer 128, with the central region being devoid of any openings.

Top side electrical connectors 138 are formed in openings. In some embodiments, the top side electrical connectors 138 may include solder regions. For example, a ball placement step may be performed to drop solder balls in the openings formed in the passivation layer 128 followed by a reflow process to reflow the solder balls. In other embodiments, a solder layer may be plated in each of the openings, followed by reflowing the solder layer in each openings to form the solder regions. In some embodiments, the top side electrical connectors 138 may also include metal pillars and solder layers (not shown) on the metal pillars. The metal pillars and solder layers may also be formed by plating or printing, followed by a reflow to shape the solder layers.

A second package 200 may be bonded to the first package 100 over the passivation layer 128, i.e., to a top surface of the passivation layer 128 that is distal from the first device die 102. In some embodiments, the second package 200 includes a second package substrate 202, and second device dies 204 bonded to the second package substrate 202. The second device dies 204 may include memory dies such as DRAM dies, Static Random Access Memory (SRAM) dies, or the like. A second molding layer 220 may mold the second device die therein. The second molding layer 220 may be formed of the same, or different material from the molding layer 120 (e.g., a molding compound, a molding underfill, a resin, an epoxy, a UV curable compound, a thermal curing compound, or the like). The second device dies 204 may be identical to each other or different from each other in various embodiments. While FIG. 1A shows the second device dies 204 bonded to the second package substrate 202 via wire bonding through wire bond leads 210, in other embodiments, flip-chip bonding may be used. Moreover, while FIG. 1A shows the second package 200 including two second device dies 204, in other embodiments, the second package 200 may include only a single second device die 204 or more than two second device dies 204 (e.g., disposed on top of each other or in a horizontal array).

Bonding pads 206 may be formed in a top surface of the second package substrate 202 to which the wire bond leads 210 are bonded. Bottom electrical connectors 224 may also be provided in the second package substrate 202. In some embodiments, the bottom electrical connectors 224 may include solder regions. In other embodiments, the bottom electrical connectors 224 may include metal pillars, metal pads, etc., and a solder layer may or may not be formed on the surface components of the bottom electrical connectors 224. The location of the bottom electrical connectors 224 correspond to the location of top side electrical connectors 138 such that each of the bottom electrical connectors 224 is aligned to a corresponding top side electrical connector 138 and electrically coupled thereto.

As shown in FIG. 1A, the second package 200 is bonded to the first package 100 to form the package 10. The package 10 thus has a Package-on-Package (PoP) structure having second package 200 as a top package, and first package 100 as a bottom package. During bonding the bottom electrical connectors 224 are aligned with, and placed in electrical contact with top side electrical connectors 138 (e.g., solder regions). A reflow may then be performed to couple the bottom electrical connectors 224 to the corresponding top side electrical connectors 138. When bottom electrical connectors 224 are solder regions, reflow causes fusion of the bottom electrical connectors 224 to the top side electrical connectors 138. It should be understood that while FIG. 1A shows a PoP package, the concepts of the present disclosure are equally applicable to any other package, for example, an InFO package including multiple dies, a standalone InFO package (e.g., not including the second package), a multi-die InFO package (i.e., a plurality of first device dies included in the first package), or any other package.

The package 10 is generally disposed in a housing 180 (e.g., a tray). In some instances, sidewalls 182 of the housing 180 are structured (e.g., inclined at an angle) such that when the package 10 is disposed within or on the housing 180, the sidewalls 182 contact axial edges of the RDL structure 110, damaging the RDL structure 110, and may cause delamination of the RDL structure and/or discoloration, which is undesirable. In some instances, the damage can extend to regions of the RDL structure 110 where the RDLs 112 are located, which can lead to failure of the RDL structure 110, and thereby the package 10.

Figure 2A:
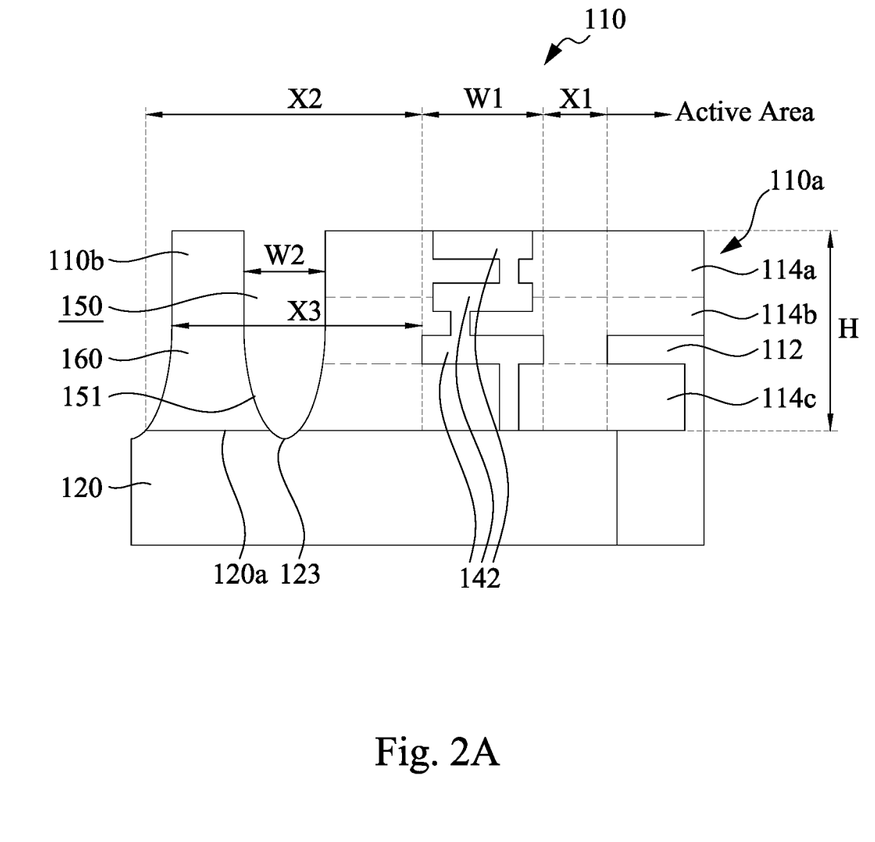
FIG. 2A is a side cross-section view of a portion of the package indicated by the arrow A in FIG. 1A.

To prevent damage to the RDL structure due to contact of the housing 180, a trench 150 is defined proximate to axial edges of the RDL structure 110 through each of the plurality of dielectric layers 114. Referring also now to FIG. 2A, the trench 150 divides the RDL structure 110 into a first portion 110a that includes the active area of the RDL structure 110 within which the RDLs 112 are located, and a second portion 110b disposed axially outwards of the first portion 110a. The second portion 110b forms a pillar 110b that is disposed axially outwards of the first portion 110a (e.g., axially outward of either axial edges of the first portion 110a) of the RDL structure 110 and separated from the first portion 110a of the RDL structure 110 by the trench 150, and includes each of the plurality of dielectric layers 114. For example, as shown in FIG. 2A, the RDL structure 110 includes a first dielectric layer 114a, a second dielectric layer 114b, and a third dielectric layer 114c that is coupled to the molding layer 120, with the second dielectric layer 114b interposed between the first and third dielectric layers 114c. While FIG. 2A shows the RDL structure 110 as including three dielectric layers 114a-c, the RDL structure 110 can include any number of dielectric layers, in various embodiments.

With continued reference to FIG. 2A, in some embodiments, the edge RDLs 142 may be separated from the closest RDL 112 by a first axial distance X1 (e.g., in a range of 15 microns to 25 microns, inclusive), and the edge RDL 142 has a width W1 in a range of 0.5 microns to 60 microns, inclusive). In some embodiments, an axial outer edge 160 of the RDL structure 110, i.e., the axial outer edge 160 of the pillar 110b, is removed (e.g., a via laser cutting process) such that at least a portion of the axial outer edge 160 proximate to the molding layer 120 has a curved profile. A second distance X2 from an axially outer edge of the edge RDL 142 to an axially outer most edge of the pillar 110b proximate to a base of the pillar 110b may be in a range of 35 microns to 50 microns, inclusive. In some embodiment, a distance X3 from an axial outer edge of the edge RDL 142 to an axial outer edge of the pillar 110b distal from the base of the pillar 110b is in a range of 20 microns to 30 microns, inclusive. In some embodiments, a height H of the RDL structure 110 may be in a range of 2 microns to 50 microns. In some embodiments, a height of the first trench 150 may be in a range of 40 microns to 250 microns. In some embodiments, a first ratio of a width of the trench 150 to a height of the trench 150 may be at least 0.04, for example, in a range of 0.05 to 0.2, inclusive. The first ratio ensures that there is sufficient separation between the first portion 110a where the active structures of the package 100 are disposed, and the pillar 110b, while inhibiting significant reduction in width of the pillar 110b relative to the height H such that the pillar 110b has sufficient mechanical strength to withstand mechanical forces exerted by the housing 180 thereon. Too small a first ratio would bring the pillar 110b too close to the first portion 110a where the pillar 110b may impact the first portion 110a when positioning in the housing 180, and too high a ratio may reduce mechanical strength of the pillar 110b. In some embodiments, a first distance from an outer edge of the trench 150 to an outer edge of the package 100 may be in a range of 12 microns to 30 microns, inclusive. In some embodiments, a second ratio of a width W2 of trench 150 to the first distance may be in a range of 0.5 to 3.0, inclusive. Too small a second ratio would result in the pillar 110b having too small a width and, thus lower mechanical strength, and too high a second ratio would result in the pillar 110 being located too thick resulting in wastage of space, or the pillar 110b being located too far from the outer edge of the package 100 such that it is unable to effectively interact with the housing 180 to prevent mechanical damage to first portion 110a.

The trench 150 may be formed using a laser cutting or laser drilling process using a laser beam. For example, a $CO_2$ laser, an neodymium (Nd) and neodymium yttrium-aluminum-garnet (Nd:YAG) laser, a laser microjet, or a fiber laser may be used to form the trench 150. The laser may be used to cut through the plurality of dielectric layers 114 using a vaporization cutting process, a melt and blow process, a thermal stress cracking process, a stealth dicing process, a reactive cutting process, or a combination thereof, for example, based on the material from which the RDL structure 110 is formed. In such embodiments, a wall portion 151 of the wall of the trench 150 proximate to the first device die 102 is curved. In some embodiments, the trench 150 may have a trench width W2 at a location where the walls of the trench are straight, in a range of 8 microns to 12 microns, inclusive.

In some embodiments, the laser beam may also cut through a portion of the molding layer 120 such that a cavity 123 is formed in the molding layer 120 at a base of the trench 150 on the bottom surface 120a of the molding layer 120, the cavity 123 being continuous with the trench 150. Thus, cutting the trench 150 in the RDL structure 110 physically separates and disconnects the pillar 110b from the first portion 110a of the RDL structure 110, which includes the active structures of the RDL structure 110. As shown in FIG.

1A, when the package 10 is disposed in the substrate, stresses exerted on the pillar 110b due to the force of the sidewall 182 of the housing 180 contacting the pillar 110b is limited to the pillar 110b and is not transmitted to the first portion 110a of the RDL structure 110. In this manner, the first portion 110a of the RDL structure 110 is protected from any damage in spite of the housing 180 contacting the pillar 110b. In some embodiments, a depth of the cavity 123 may be in a range of 0 microns to 50 microns.

Figure 2B:
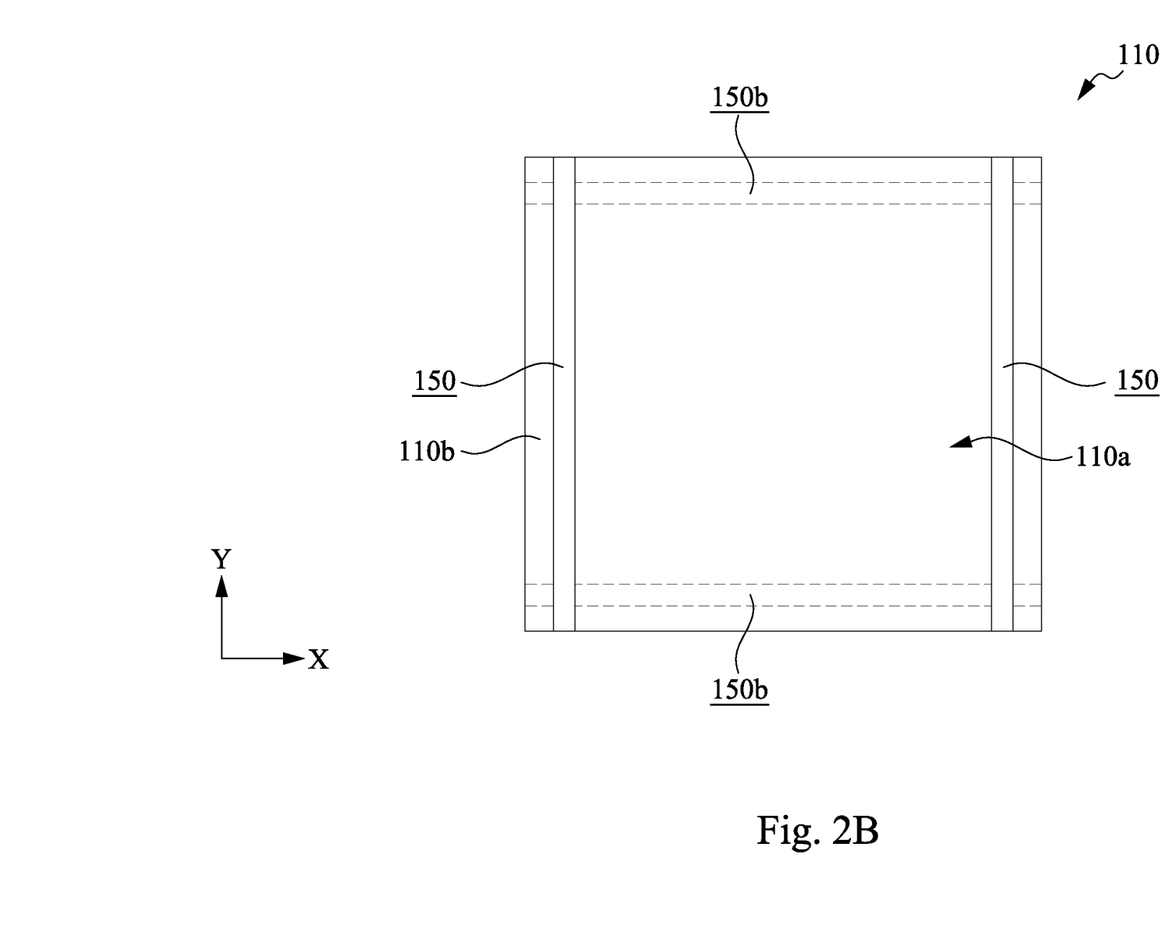
FIG. 2B is a bottom view of the package of FIG. 1A showing the trenches defined through the RDL structure.

FIG. 2B shows a bottom view of the RDL structure 110. As shown in FIG. 2B, trenches 150 may defined through the RDL structure 110 proximate only to axial edges of the substrate in a first direction (e.g., the X-direction) and extend in a second direction (e.g., the Y-direction). In some embodiments, the trenches 150 may be first trenches, and second set of trenches 150b may additionally, or alternatively be defined through the RDL structure 110 proximate to axial edges of the RDL structure 110 in the second direction (e.g., the Y-direction) and extend in the first direction (e.g., the X-direction). In some embodiments, each of the second set of trenches 150b may have a width in a range of 8 microns to 12 microns, inclusive. The second set of trenches 150b may have the same width or different width than the width of the first set of trenches 150. In some embodiments, a first ratio of a width of the second set of trenches 150b to a height thereof may be at least 0.04 to 0.2, inclusive, with the first ratio selected so as to provide the same benefits as described with respect the first trenches 150. In some embodiments, a first distance from an outer edge of each the second trench 150b to an outer edge of the package 100 may be in a range of 12 microns to 30 microns, inclusive. In some embodiments, a second ratio of a width of the second trench 150b to the first distance may be in a range of 0.5 to 3.0, inclusive, with the second ratio selected to provide the same benefits as described in detail with respect to the first trenches 150.

Figure 3:
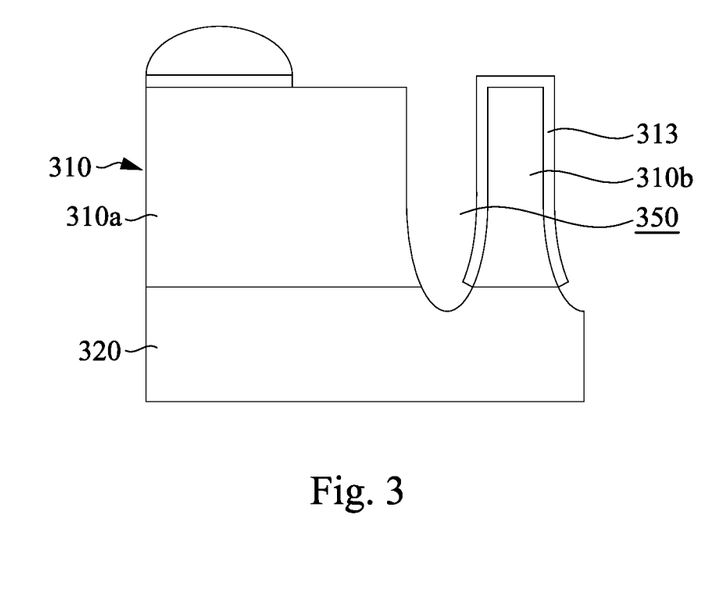
FIGS. 3-5 are side cross-section views of various embodiments of portions of dielectric substrates that include trenches formed by laser cutting.

In some embodiments, an electromagnetic shielding layer may be coated on at least a portion of the RDL structure disposed axially outward of the trench, i.e., on the pillar. For example, FIG. 3 is a side cross-section view of a portion of RDL structure 310. The RDL structure 310 may be included in the first package 100 or any other package. The RDL structure 310 may include a plurality of dielectric layers. A trench 350 is formed proximate to axial edges of the RDL structure 310 through each of the plurality of dielectric layers such that the trench 350 divides the RDL structure 310 into a first portion 310a including active components of the RDL structure 310 (e.g., RDLs 112), and a second portion 310b or pillar 310b disposed axially outwards of the first portion 310a of the RDL structure 310 and separated therefrom by the trench 350. The first and second portions 310a and 310b of the RDL structure 310 are coupled to a molding layer 320, which may be substantially similar to the molding layer 120.

The pillar 310b is coated with an electromagnetic shielding layer 313. In some embodiments, the electromagnetic shielding layer may include a metal layer, for example, a copper, brass, nickel, silver, steel, or tin layer, alloys or combinations thereof. In some embodiments, the electromagnetic shielding layer 313 may include a portion of a seed layer that may be used to form the RDLs 112, or the electrical connectors 124, that remains disposed on at least the pillar 310b (i.e., the second portion of the iRDL, structure 310 disposed axially outward of the trench 350). In other embodiments, the electromagnetic shielding layer 313 may be coated on at least a portion of the pillar 310b after the trench 350 has been formed though the RDL structure 310. The electromagnetic shielding layer 313 may be formed by sputtering, e-beam evaporation, physical vapor deposition (PVD), or chemical vapor deposition (CVD) and may be deposited after the trench 350 has been formed.

Figure 4:
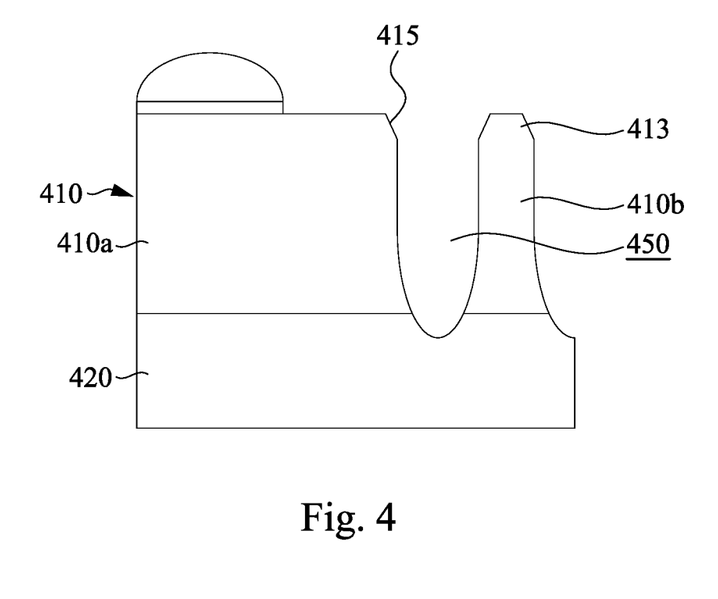

FIGS. 1A-B and 2A show a tip of the pillar 110b distal from the first device die 102 having a flat profile. In other embodiments, the tip of the pillar 110b may have any other shape or profile. For example, FIG. 4 is a side cross-section view of a portion of RDL structure 410. The RDL structure 410 may be included in the first package 100 or any other package. The RDL structure 410 may include a plurality of dielectric layers. A trench 450 is formed proximate to axial edges of the RDL structure 410 through each of the plurality of dielectric layers such that the trench 450 divides the RDL structure 410 into a first portion 410a including active components of the RDL structure 410 (e.g., RDLs 112), and a second portion 410b or pillar 410b disposed axially outwards of the first portion 410a of the RDL structure 410, and separated therefrom by the trench 450. The first and second portions 410a and 410b of the RDL structure 410 are coupled to a molding layer 420, which may be substantially similar to the molding layer 120. A tip 413 of the pillar 410b located axially distal from a molding layer, and thereby a first device die (e.g., the first device die 102) that may be molding within the molding layer 420, as previously described herein with respect to FIG. 1A, is rounded. Moreover, a corner 415 of the first portion 410a may be also be rounded. For example, the tip 413 and the corner 415 may have a semi-circular profile, an elliptical profile, or an oval profile. The tip 413 and/or the corner 415 may be rounded using the same laser beam that is used to cut the trench 450. In other embodiments, physical etching (e.g., using a polisher or grinder), or chemical etching (e.g., using a wet etchant) may be used to round the tip 413. In some embodiments, the rounding of the tip 413 and the corner 415 may be a byproduct of the laser cutting or photolithography process used to form the trench 450.

Figure 5:
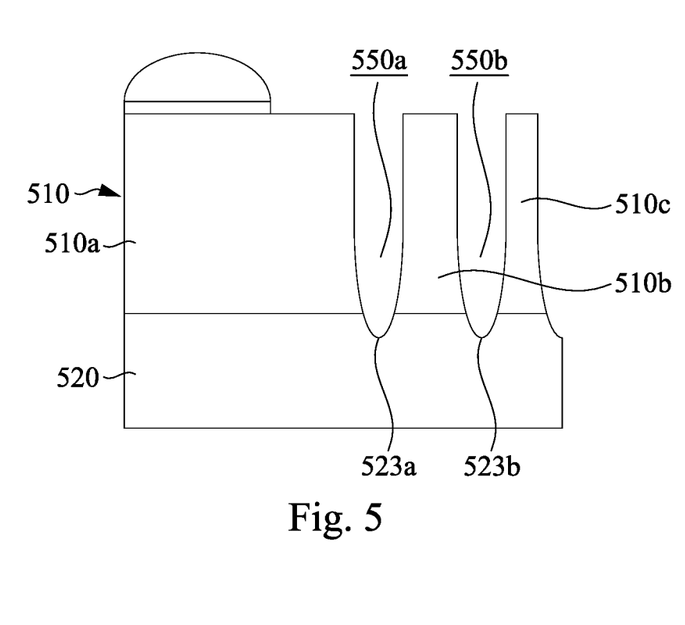

While FIGS. 1-4 show dielectric substrates including a single trench, in other embodiments, a plurality of trenches may be defined through the RDL structure of a package. For example, FIG. 5 is a side cross-section view of a portion of a RDL structure 510. The RDL structure 510 may be included in the first package 100 or any other package. The RDL structure 510 may include a plurality of dielectric layers. A first trench 550a is formed proximate to axial edges of the RDL structure 510 through each of the plurality of dielectric layers, and a second trench 550b is formed proximate to the axial edges and axially outwards of the first trench 550a. The first trench 550a and the second trench 550b divide the RDL structure 510 into a first portion 510a including active components of the RDL structure 510 (e.g., RDLs 112), a second portion that forms a first pillar 510b disposed axially outwards of the first portion 510a of the RDL structure 510 and separated therefrom by the first trench 550a, and third portion forming a second pillar 510c disposed axially outward of the first pillar 510b and separated therefrom by the second trench 550b.

The first portion 510a, the first pillar 510ba, and the second pillar 510c of the RDL structure 510 are coupled to a molding layer 520, which may be substantially similar to the molding layer 120. Each of the first trench 550a and the second trench 550b may be formed by laser cutting. Moreover, the laser cutting process may also remove a portion of the molding layer 520 proximate to the base of the first and second trenches and 550a and 550b such that a first cavity 523a is formed in the molding layer 520 at base of the first trench 550a, and a second cavity 523b is formed at the base of the second trench 550b. The first cavity 523a and the second cavity 523b may be continuous with the first trench 550a and the second trench 550b, respectively. While FIG. 5 shows the first and the second trench 550a and 550b defined in the RDL structure 510, in other embodiments, any number of trenches may be formed in the RDL structure 510 or any other RDL structure described herein (e.g., the RDL structure 110, 310, 410, 510). In some embodiments, a width of each of the trenches 550a and 550b may be in a range of 8 microns to 12 microns, inclusive, a height of each of the trenches 550a and 550b may be in a range of 40 microns to 250 microns, and a ratio of the width to the height of the trenches 550a and 550b may be at least 0.04, for example, in a range of 0.05 to 0.2, inclusive.

Figure 6:
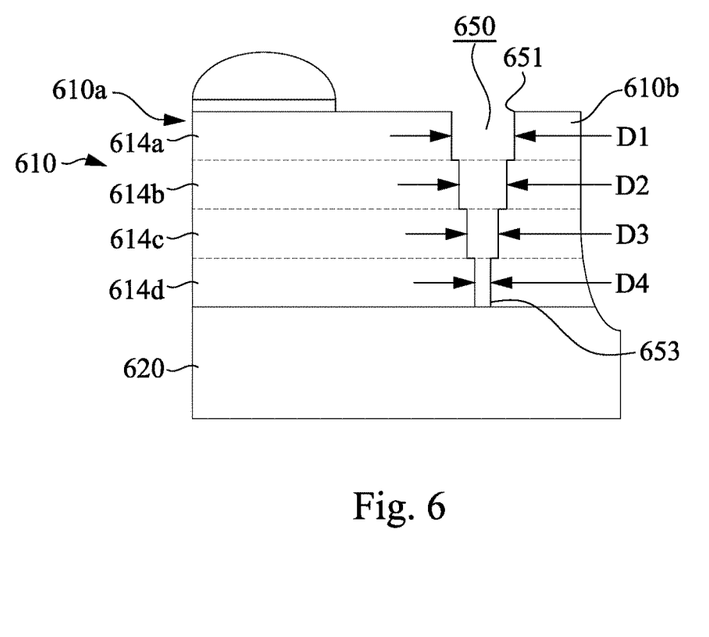
FIGS. 6-7 are side cross-section views of various embodiments of portions of RDL structure that include trenches formed by photolithography and etching.

The trenches shown in FIGS. 1-5 are formed using laser cutting. In other embodiments, the one or more trenches formed in any of the dielectric substrates described herein may be formed using any other suitable process. For example, the one or more trenches may be formed in any of the dielectric substrates described herein using a photolithographic masking and etching process. For example, FIG. 6 is a side cross-section view of a portion of a RDL structure 610. The RDL structure 610 may be included in the first package 100 or any other package. The RDL structure 610 is bonded to a molding layer 620 that may include at least a first device die (e.g., the first device die 102) molded therein.

The RDL structure 610 may include a plurality of dielectric layers, for example, a first dielectric layer 614a that is distal most from the molding layer 620, a second dielectric layer 614b below the first dielectric layer 614a, a third dielectric layer 614c below the second dielectric layer 614b, and a fourth dielectric layer 614d below the third dielectric layer 614c and bonded to the molding layer 620. In other embodiments, the RDL structure 610 may include any number of dielectric layers. A trench 650 is formed proximate to axial edges of the RDL structure 610 through each of the plurality of dielectric layers 614a-d. The trench 650 divides the RDL structure 610 into a first portion 610a including active components of the RDL structure 610 (e.g., RDLs 112), a second portion that forms a pillar 610b disposed axially outwards of the first portion 610a of the RDL structure 610 and separated therefrom by the trench 650. In some embodiments, the pillar 610b may be coated with an electromagnetic shielding layer (e.g., the electromagnetic shielding layer 313). In some embodiments, a tip of the pillar 610b may be rounded. Moreover, a plurality of trenches 650 may be formed in the RDL structure 610 so as to form a plurality of pillars at axial edges of the RDL structure 610.

The trench 650 may be formed using a photolithographic masking and etching process. For example, a masking layer (e.g., a positive or negative photoresist) may be deposited on a surface of the RDL structure 610 that is distal from the molding layer 620. The masking layer may be patterned (e.g., using photolithograph) to define a trench pattern. The first dielectric layer 614a is then etched, for example, using a dry etching or wet etching process. In some embodiments, the etch may be an anisotropic etch (e.g., a reactive ion etch (RIE), neutral beam etch (NBE), deep reactive ion etch (DRIE), and the like, or combinations thereof,) which selectively etches the exposed portions of the dielectric layers 614a-d in the vertical direction. In some embodiment, all the dielectric layers 614a-d may be etched in a single masking and etching step. In other embodiments, each dielectric layer 614a-d may be etched via sequential masking and etching steps. For example, a first masking and etching step may be used to etch through the first dielectric layer 614a until the etch reaches the second dielectric layer 614b. Subsequently a second masking and etching step may be performed to etch through the second dielectric layer, and so on and so forth, until all the dielectric layers 614a-d have been etched to form the trench 650.

In some embodiments, photolithographic masking and etching (e.g., sequential masking and etching of each dielectric layer) may cause the trench 650 to have a stepwise reduction in width from the first dielectric layer 614a to the fourth dielectric layer 614d such that the trench 650 (i.e., walls of the trench 650) has a stepped or staircase profile from a first axial end 651 of the trench 650 that is distal from the molding layer 620 and thereby, the at least one first device die molded in the molding layer 620, to a second axial end of the trench 650 that is proximate to the molding layer 620 and thereby, the at least one first device die molded therein. For example, as shown in FIG. 6, a first portion of the trench 650 formed through the first dielectric layer 614a may have a first width D1 that is larger than a second width D2 of a second portion of the trench 650 formed through the second dielectric layer 614b. Similarly, the second width D2 may be larger than a third width D2 of a third portion of the trench 650 formed through the third dielectric layer 614c, and the third width D3 may be larger than a fourth width D4 of a fourth portion of the trench 650 formed through the fourth dielectric layer 614d. In some embodiments, the first width D1 may be in a range of 10microns to 15 microns, inclusive, and the fourth width D4 may be in a range of 2-10 microns, inclusive, with the second width D2 and the third width D3 having intermediate widths therebetween. In some embodiments, a different between the widths of each subsequent portion of the trench from the first dielectric layer 614a to the fourth dielectric layer 614d may be equal (e.g., D1-D2=D2-D3=D3-D4). Thus, the trench 650 may have a symmetric profile from the first axial end 651 to the second axial end 653 thereof.

Figure 7:
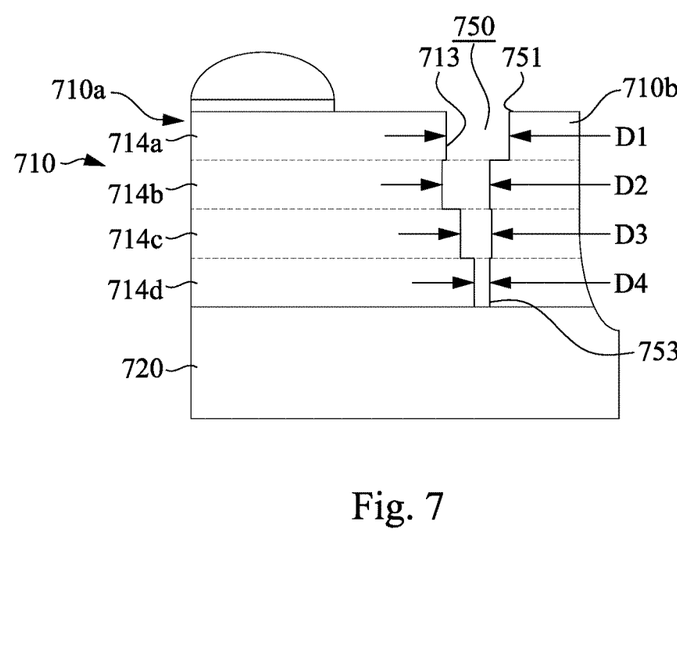

In some embodiments, forming the trench though the RDL structure using a photolithographic masking and etching process may cause the trench to have an asymmetric profile. For example, FIG. 7 is a side cross-section view of a portion of RDL structure 710. The RDL structure 710 may be included in the first package 100 or any other package. The RDL structure 710 is bonded to a molding layer 720 that may include at least a first device die (e.g., the first device die 102) molded therein.

The RDL structure 710 may include a plurality of dielectric layers, for example, a first dielectric layer 714a that is distal most from the molding layer 720, a second dielectric layer 714b below the first dielectric layer 714a, a third dielectric layer 714c below the second dielectric layer 714b, and a fourth dielectric layer 714d below the third dielectric layer 714c and bonded to the molding layer 720. In other embodiments, the RDL structure 710 may include any number of dielectric layers. A trench 750 is formed proximate to axial edges of the RDL structure 710 through each of the plurality of dielectric layers 714a-d. The trench 750 divides the RDL structure 710 into a first portion 710a including active components of the RDL structure 710 (e.g., RDLs 112), a second portion that forms a pillar 710b disposed axially outwards of the first portion 710a of the RDL structure 710 and separated therefrom by the trench 750. In some embodiments, the pillar 710b may be coated with an electromagnetic shielding layer (e.g., the electromagnetic shielding layer 313). In some embodiments, a tip of the pillar 710b may be rounded. Moreover, a plurality of trenches 750 may be formed in the RDL structure 750 so as to form a plurality of pillars at axial edges of the RDL structure 750, each being separated from each other by a trench.

The trench 750 may be formed using a photolithographic masking and etching process, for example, as described with respect to the RDL structure 710. In some embodiments, photolithographic masking and etching may be performed sequentially from the first dielectric layer 714a to the fourth dielectric layer 714d. However, due to slight misalignment of subsequent masking layers or asymmetric etching of the dielectric layers, the photolithographic masking and etching step may result in the trench 750 having an asymmetric profile from a first axial end 751 of the RDL structure 710 that is distal from the molding layer 720, to a second axial end 753 of the RDL structure 710 that is proximate to the molding layer 720. For example, a first axial edge 713 of the first dielectric layer 714a that forms a portion of the trench 750, overhangs a corresponding second axial edge 715 of the second dielectric layer 714b that is adjacent to (i.e., below) the first dielectric layer 714a.

While the trench 750 has an asymmetric profile, the trench 750 may still have a stepwise reduction in width from the first dielectric layer 714a to the fourth dielectric layer 714d such that the trench 750 (i.e., walls of the trench) has a stepped or staircase profile from a first axial end 751 of the trench that is distal from the molding layer 720 and thereby, the at least one first device die molded in the molding layer 720, to a second axial end of the trench 750 that is proximate to the molding layer 720 and thereby, the at least one first device die molded therein. For example, as shown in FIG. 7, a first portion of the trench 750 formed through first dielectric layer 714a may have a first width D1 that is larger than a second width D2 of a second portion of the trench 750 formed through the second dielectric layer 714b. Similarly, the second width D2 may be larger than a third width D3 of a third portion of the trench 750 formed through the third dielectric layer 714c, and the third width D3 may be larger than a fourth width D4 of a fourth portion of the trench 750 formed through the fourth dielectric layer 714d. In some embodiments, the first width D1 may be in a range of 10 microns to 15 microns, inclusive the fourth width D4 may be in a range of 2 microns to 10 microns, inclusive, with the second width D2 and the third width D3 having intermediate widths therebetween. In some embodiments, a difference between the widths of each subsequent portion of the trench from the first dielectric layer 714a to the fourth dielectric layer 714d may be equal (e.g., D1-D2=D2-D3=D3-D4).

Figure 8:
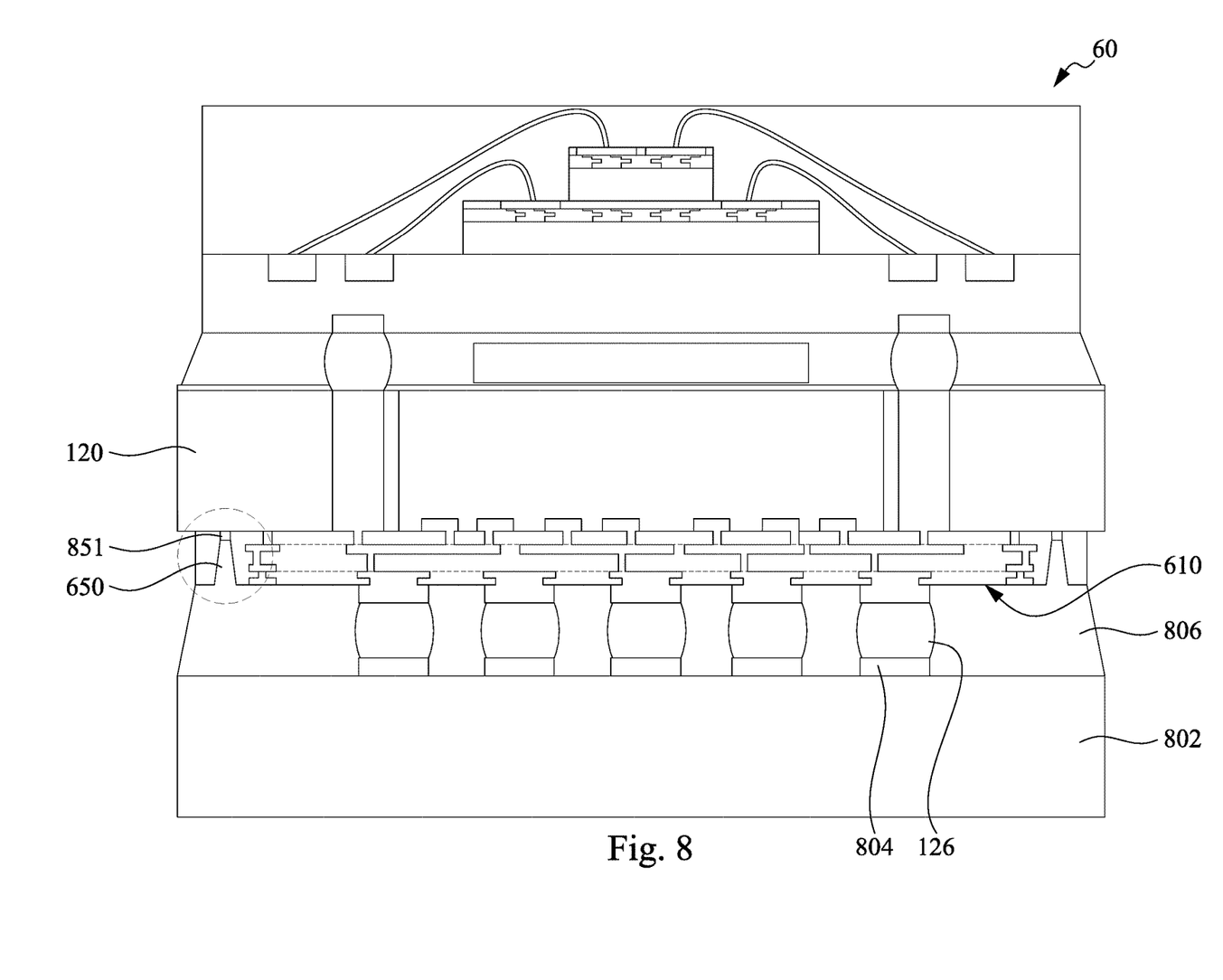
FIG. 8 is a side cross-section view of a package including the RDL structure of FIG. 6, which is coupled to a printed circuit board (PCB), according to an embodiment.

FIG. 8 is a side cross-section view of a package 60 coupled to a PCB 802, according to an embodiment. The package 60 is substantially similar to the package 10, with the only difference being that instead of the RDL structure 110, the RDL structure 610 is bonded to the molding layer 120. The PCB 802 includes a plurality of PCB bonding pads 804 to which the solder regions 126 are bonded for electrically coupling the PCB 802 to the package 60. An underfill layer 806 may be filled between (e.g., an adhesive, a polymer, an encapsulation layer, etc.) in the area between the RDL structure 610 and the PCB 802. In some embodiments, the underfill layer 806 may be unable to completely fill the trench 650 such that an underfill void 851 remains in the trench 650, for example, proximate to a base of the trench 650.

Figure 9:
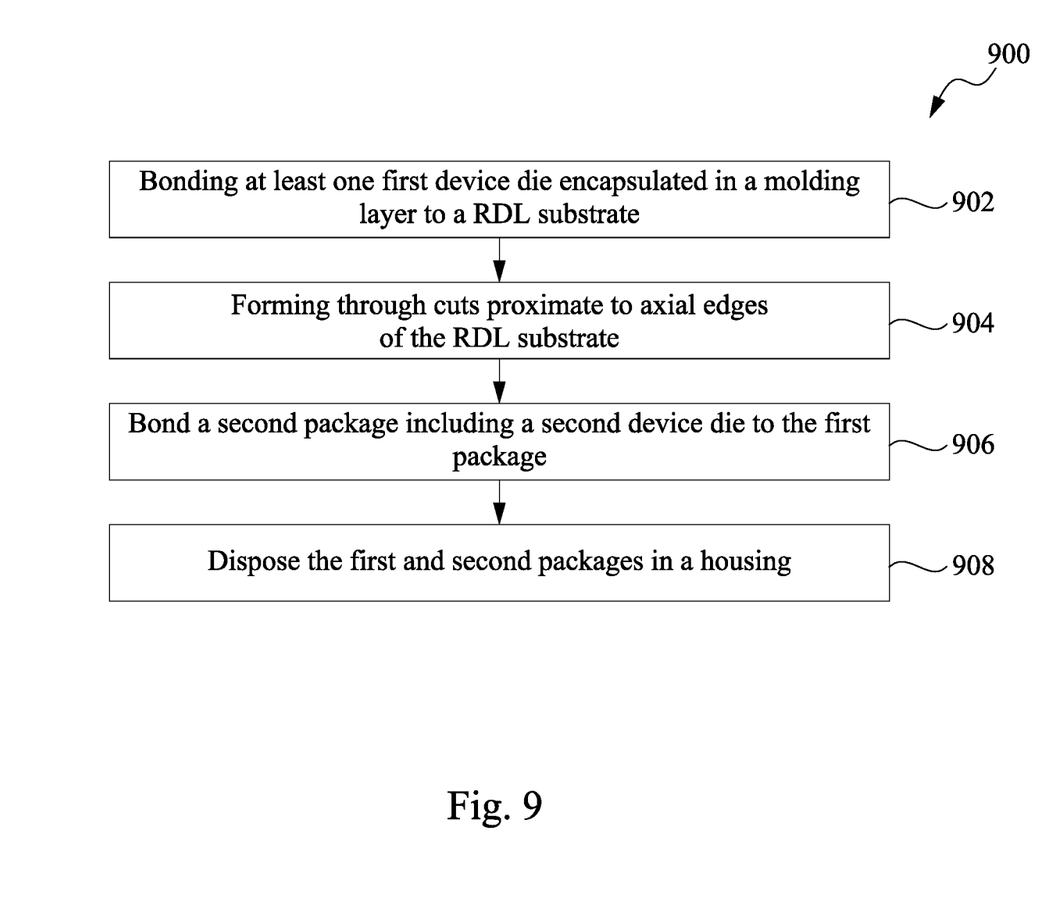
FIG. 9 is a schematic flow chart of a method of forming a package having a RDL structure with a trench, according to an embodiment.

FIG. 9 is a schematic flow chart of a method 900 of forming RDL structure including a trench. The method 900 may be used to form the package 10 or any other package described herein. The method 900 includes bonding at least one first device die encapsulated in a molding layer to a redistribution line (RDL) substrate to form a first package, at 902. For example, the first package may include the first package 100 including the RDL structure 110 having the first device die 102 that is encapsulated in the molding layer 120 bonded thereto. The RDL structure (e.g., the RDL structure 110, 310, 410, 510, 610, 710) includes a plurality of dielectric layers (e.g., the dielectric layers 114), and a plurality of RDLs (e.g., the RDLs 112) formed through the plurality of dielectric layers. The first device die (e.g., the first device die 102) may be molded within a molding layer (e.g., the molding layer 120). The first package may include other components as previously described with respect to the first package 100.

At 904, trenches (e.g., the trench 150, 350, 450, 550a-b, 650, 750) are formed proximate to axial edges of the RDL structure through the RDL structure, each of the trenches extending from a first axial edge to a second edge of the RDL structure along a first direction (e.g., the X-direction) or a second direction perpendicular to the first direction (e.g., the Y-direction). In some embodiments, the trench is formed by cutting through the plurality of dielectric layers using a laser beam, for example, as described with respect to FIGS. 1-5. In other embodiments, the trench may be formed by a photolithographic masking and etching process as described with respect to FIGS. 6-7. In some embodiments, a plurality of trenches may be formed in the RDL structure.

In some embodiments, the method 900 may also include bonding a second package (e.g., the second package 200) to the first package, at 906, as previously described herein. In some embodiments, the trench may be formed in the RDL structure after bonding the second package to the first package. At 908, the first and second packages are disposed in a housing (e.g., the housing 180). A sidewall of the housing may contact a second portion of the dielectric layer located axially outwards of the trench, the second portion forming a pillar that is separate from a first portion of the RDL structure located axially inwards of the trench, and which includes active components (e.g., RDLs 112) of the dielectric substrate. Thus, only the pillar contacts the side wall of the housing, and any damage to the pillar due to the contact is inhibited from being transmitted to the first portion of the RDL structure due to the trench separating pillar from the first portion.

In some embodiments, a package, comprises at least one first device die, and a RDL structure having the at least one first device die bonded thereto. The RDL structure comprises a plurality of dielectric layers, and a plurality of RDLs formed through the plurality of dielectric layers. A trench is defined proximate to axial edges of the RDL structure through each of the plurality of dielectric layers.

In some embodiments, a package comprises at least one first device die, and a RDL structure having the at least one first device die bonded thereto. The RDL structure comprises a plurality of dielectric layers, and a plurality of redistribution lines (RDLs) formed through the plurality of dielectric layers. A pillar is disposed axially outwards of the RDL structure and separated from the RDL structure, the pillar comprising the plurality of dielectric layers.

In some embodiments, a method, comprises bonding at least one first device die encapsulated in a molding layer to a redistribution line (RDL) structure to form a first package; and forming a trench proximate to axial edges of the RDL structure through the RDL structure, the trench extending from a first axial edge to a second axial edge of the RDL structure along a first direction or a second direction perpendicular to the first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
bonding at least one first device die encapsulated in a molding layer to a redistribution line (RDL) structure to form a package, the RDL structure including a plurality of RDLs disposed in a plurality of dielectric layers; and
forming a trench proximate to axial edges of the RDL structure through the RDL structure, the trench extending from a first axial edge to a second axial edge of the RDL structure along a first direction or a second direction perpendicular to the first direction, wherein the trench completely separates the RDL structure into a first portion adjacent a second portion, and wherein each of the plurality of RDLs is included in the first portion but not the second portion.

2. The method of claim 1, wherein forming the trench includes cutting through the plurality of dielectric layers using a laser beam.

3. The method of claim 1, wherein forming the trench includes:
forming a masking layer over a surface of the RDL structure distal from the molding layer;
patterning the masking layer; and
performing an anisotropic etching process to the plurality of dielectric layers using the patterned masking layer as an etch mask.

4. The method of claim 1, wherein the trench is formed to have a stepped profile having a width that decreases from the first axial edge towards the second axial edge.

5. The method of claim 1, wherein the trench is formed to have an asymmetric profile.

6. The method of claim 1, wherein the package is a first package, the method further comprising:
bonding a second package including a second device die to the first package; and
disposing the bonded first package and the second package in a housing.

7. The method of claim 1, further comprising coating a portion of the RDL structure adjacent the trench with an electromagnetic shielding layer after forming the trench.

8. The method of claim 1, wherein forming the trench includes cutting a portion of the molding layer to form a cavity at a base of the trench.

9. A method, comprising:
bonding at least one first device die encapsulated in a molding layer to a redistribution line (RDL) structure to form a first package, the RDL structure including a plurality of RDLs disposed in a plurality of dielectric layers;
forming a trench proximate to axial edges of the RDL structure through the RDL structure, the trench extending from a first axial edge to a second axial edge of the RDL structure, wherein forming the trench forms a pillar vertically protruding from the molding layer, the pillar including the plurality of dielectric layers without the plurality of RDLs; and
bonding a second package including a second device die to the first package.

10. The method of claim 9, wherein forming the trench includes cutting through the plurality of dielectric layers using one of a laser beam or a photolithographic masking and etching processes.

11. The method of claim 9, wherein forming the trench includes performing an anisotropic etching process.

12. The method of claim 11, wherein the anisotropic etching process causes the trench to have a profile having a width that decreases stepwise in a direction towards the molding layer.

13. The method of claim 11, wherein the anisotropic etching process causes the trench to have an asymmetric profile.

14. The method of claim 9, further comprising disposing the bonded first package and the second package in a housing.

15. The method of claim 9, further comprising forming an electromagnetic shielding layer over a portion of the RDL structure adjacent the trench after forming the trench.

16. The method of claim 9, wherein forming the trench removes a portion of the molding layer.

17. The method of claim 9, wherein the trench is formed to extend along a first direction or a second direction perpendicular to the first direction.

18. A method, comprising:
bonding at least one first device die encapsulated in a molding layer to a redistribution line (RDL) structure to form a first package, the RDL structure including a first portion adjacent a second portion, wherein the first portion includes a plurality of RDLs extending through a plurality of dielectric layers, and wherein the second portion is free of any RDLs;
forming a trench proximate to axial edges of the RDL structure through the RDL structure, the trench extending laterally from a first axial edge to a second axial edge of the RDL structure and vertically through each of the plurality of dielectric layers to completely separate the first portion from the second portion;
bonding a second package including a second device die to the first package; and
disposing the bonded first package and the second package in a housing.

19. The method of claim 18, wherein forming the trench includes performing an anisotropic etching process to cut through each of the plurality of dielectric layers.

20. The method of claim 18, further comprising coating a portion of the RDL structure adjacent the trench with an electromagnetic shielding layer after forming the trench.

* * * * *